United States Patent [19]

Connell et al.

[11] 4,395,683
[45] Jul. 26, 1983

[54] FREQUENCY SYNTHESIZERS

[75] Inventors: Peter P. Connell, Marlow; Malcolm F. Morgan, High Wycombe, both of England

[73] Assignee: Racal-Dana Instruments Limited, Bracknell, England

[21] Appl. No.: 272,107

[22] Filed: Jun. 10, 1981

[30] Foreign Application Priority Data

Jul. 12, 1980 [GB] United Kingdom ............... 8022857

[51] Int. Cl.³ .............................................. H03L 7/22
[52] U.S. Cl. .......................................... 331/2; 331/38; 328/14
[58] Field of Search ......................... 328/14; 331/2, 38

[56] References Cited

U.S. PATENT DOCUMENTS 3,379,992  4/1968  Hoo ....................................... 331/38
3,600,699  8/1971  Orenberg ............................... 331/2

FOREIGN PATENT DOCUMENTS 2394919  12/1979  France .
813074    5/1959   United Kingdom .
863215    3/1961   United Kingdom .
1107909   3/1968   United Kingdom .
1165325   9/1969   United Kingdom .
1173203  12/1969   United Kingdom .
1466275   3/1977   United Kingdom .

OTHER PUBLICATIONS

Article-"Frequency Synthesizers", Wireless World, Jun. 1972, by J. R. Philpott, pp. 269-271.

Primary Examiner—John S. Heyman
Attorney, Agent, or Firm—Leydig, Voit, Osann, Mayer & Holt, Ltd.

[57] ABSTRACT

A frequency synthesizer described is made up of cascaded stages each receiving a 10 MHz reference. The first stage has a multiplier producing harmonics in the range 200 to 290 MHz, and any one can be selected by a controllable bandpass filter. A divide by 100 divider feeds an output variable in 100 KHz steps in the range 2 to 2.9 MHz to the next stage. This stage has a multiplier and a bandpass filter which can be set to produce an output variable in 10 MHz steps between 180 and 270 MHz. A divide by ten divider feeds a frequency in the range 18 to 27 MHz into a phase-locked loop also receiving the output from the first stage, so as to set a VCO to produce an output which, after division by a divide by ten divider is variable in 10 KHz steps in the range 2 to 2.9 MHz. Four further stages operate similarly, so that the fourth produces an output variable in 1 MHz steps between 2 and 2.999999 MHz. The seventh or final stage produces an output variable between 20 and 30 MHz in 1 Hz steps. The multipliers and bandpass filters in each stage produce much less noise than would phase-locked loops used for multiplication purposes, and are also more rapidly settable.

4 Claims, 2 Drawing Figures

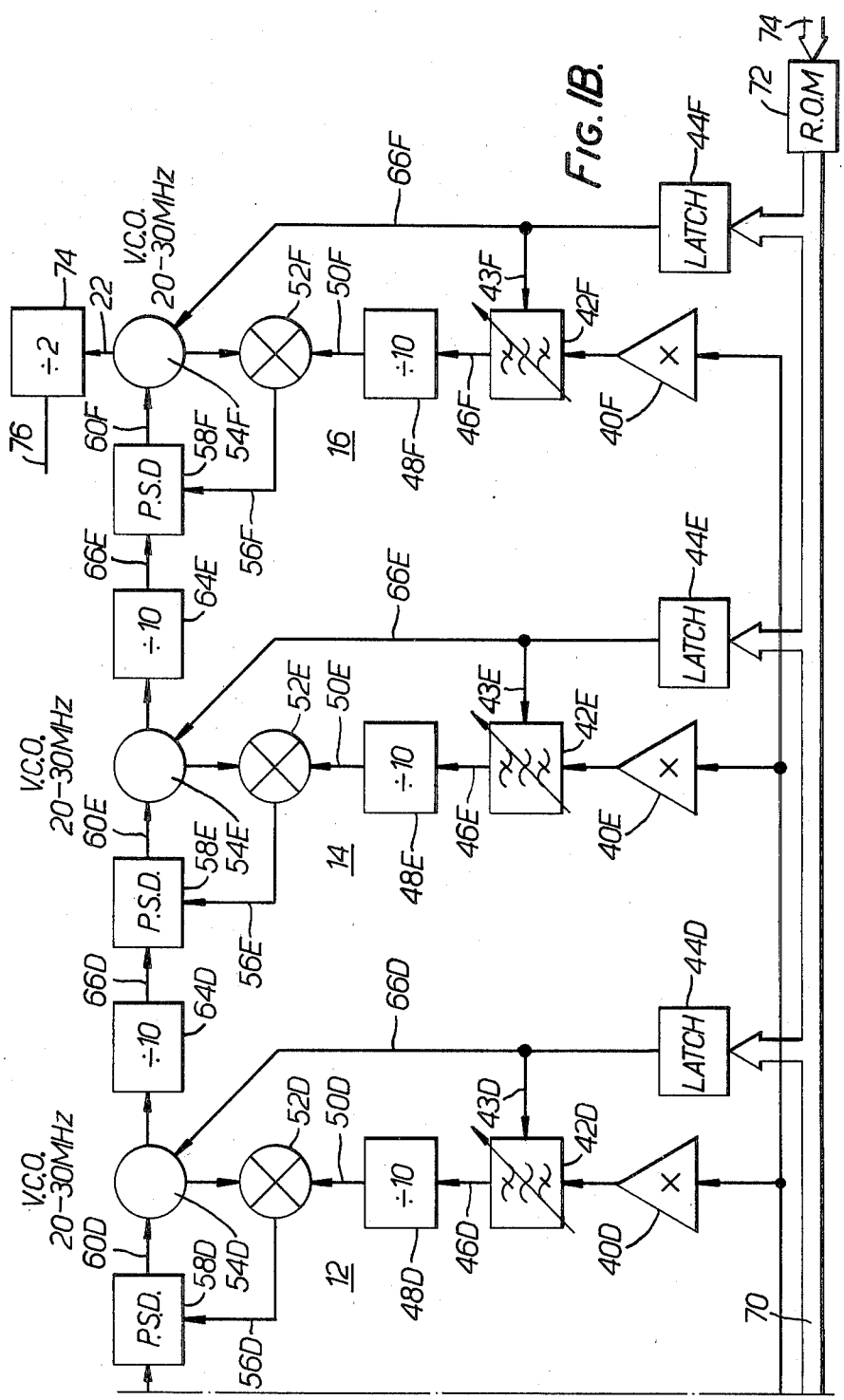

FREQUENCY SYNTHESIZERS

BACKGROUND OF THE INVENTION

The invention relates to electrical circuit arrangements and more specifically to frequency synthesizers for generating electrical signals at selectively different frequencies.

Frequency synthesizer circuits are known comprising a number of cascaded stages each of which for example synthesizes the value of one digit in the final output frequency. Such stages may be responsive to a reference frequency and may include means for multiplying the reference frequency to produce a frequency which is then processed to produce the output of that stage. A problem with such synthesizers is to avoid multiplication of noise within each stage.

An object of the invention is to provide an improved frequency synthesizer stage.

Another object of the invention is to provide a frequency synthesizer stage which has an improved signal to noise ratio.

BRIEF SUMMARY OF THE INVENTION

According to the invention, there is provided a stage for a frequency synthesizer, for producing an adjustable frequency whose value determines the value of one of the digits of the synthesized output frequency, the stage comprising means responsive to a predetermined reference frequency to produce multiples thereof lying within a predetermined frequency range, selectively-settable bandpass filter means for selecting one of the multiples to produce a control frequency, and combining means for producing the intermediate frequency from a combination of the control frequency and the adjustable frequency of a preceding stage.

DESCRIPTION OF THE DRAWINGS

A frequency synthesizer embodying the invention will now be described with reference to the accompanying diagrammatic drawing of which FIGS. 1A and 1B together form a circuit diagram of the frequency synthesizer.

DESCRIPTION OF THE PREFERRED EMBODIMENTS

Figure 1A:
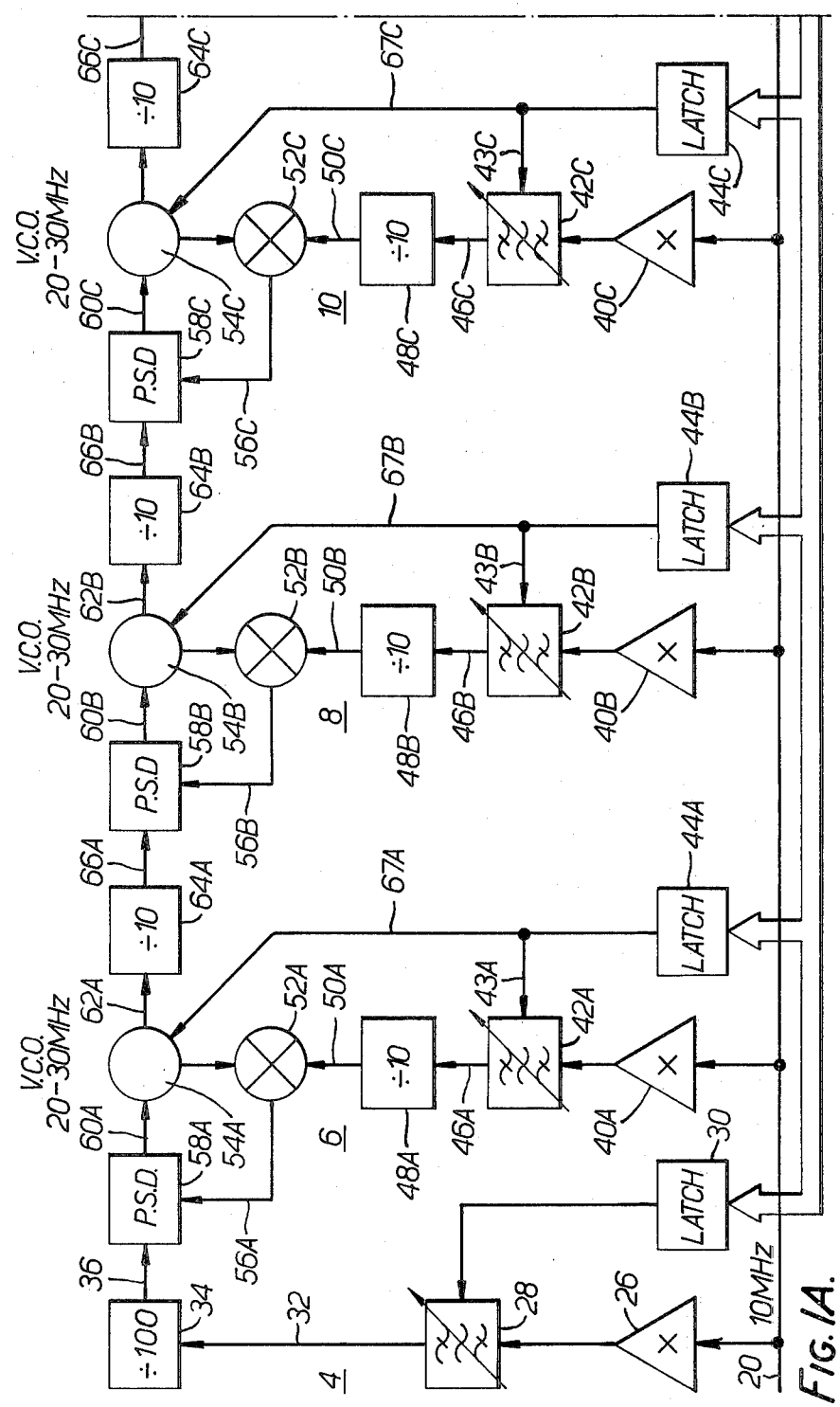

As shown in the circuit diagram, the frequency synthesizer comprises seven (in this example) cascaded stages 4, 6, 8, 10, 12, 14 and 16. Each stage has an input 20 at which is received a high purity and high stability reference signal of, in this example, 10 MHz. The final stage 16 has an output line 22 at which is produced the output of the synthesizer which, in this example, lies between 20 and 30 MHz and is variable within these limits in 1 Hz steps.

In a manner to be explained, the output frequency is selectable digitally, and the digital control signals for this purpose are received from a control channel 24.

The initial stage 4 comprises a multiplier circuit 26 which multiplies the 10 MHz reference signal on line 20 to produce harmonics in the range 200 to 290 MHz on an output line which feeds an adjustable bandpass filter 28. The latter can be set, by means of a digital input-analogue output latch 30, so as to select any one of the harmonics and therefore produces an output on a line 32 which is variable between 200 and 290 MHz in 10 MHz steps.

The selected output is fed through a divide-by-100 divider 34 to produce an output on a line 36 which is therefore variable between 2 and 2.9 MHz in 100 KHz steps. Line 36 feeds the next stage, stage 6.

Stage 6 comprises a multiplier circuit 40A which is connected to receive the 10 MHz reference signal from line 20 and produces harmonics in the range 180 to 270 MHz which are fed to a bandpass filter 42A. Like the filter 28, the filter 42A is settable by means of signals on a line 43A from a digital input-analogue output latch 44A to select any one of the harmonics and therefore produces an output on a line 46A which is variable between 180 and 270 MHz in 10 MHz steps. The selected output is fed through a divide-by-10 divider 48A on a line 50A to one input of a mixer 52A.

The second input of the mixer 52A is fed from a voltage controllable oscillator (VCO) 54A which is controllable to produce an output frequency in the range 20 to 30 MHz. The difference frequency output of the mixer 52A is fed on a line 56A to one input of a phase-sensitive detector 58A whose second input receives the output on line 36 from stage 4.

The phase-sensitive detector 58A produces a control signal on a line 60A which adjusts the output frequency of the VCO 54A so as to tend to bring the phases of the inputs on lines 36 and 56A into equality.

The output of the VCO 54A is also fed on a line 62A to a divide-by-10 divider 64A whose output line 66A is the output of stage 6.

The analogue output of the latch 44A is fed to control the frequency of the VCO 54A on a line 67A in a manner to be explained.

In operation, the frequency of the VCO 54A will automatically be set, by the phase-locked loop consisting of the mixer 52A, the VCO 54A and the detector 58A, so that the VCO output frequency is equal to the sum of the frequencies on lines 36 and 50A.

For example, if the latch 30 is controlled so as to set the filter 28 to select a frequency of 240 MHz, the frequency on line 36 will be 2.4 MHz. If at the same time the latch 44A sets the filter 42A to select 190 MHz, then the frequency on line 50A will be 19 MHz. Therefore, the phase-locked loop will operate so that the lower sideband output on line 56A is 2.4 MHz and therefore in phase with the input on line 36, and this condition will be satisfied when the frequency of the VCO 54A is 21.4 MHz.

Therefore, the output of the stage 6 on line 66A is between 2 and 2.99 MHz and is adjustable in 10 KHz steps.

Stages 8 to 16 are of the same general form as stage 6 and will not be separately described: in stages 8 to 16, items corresponding to items in stage 6 have similar reference numbers but are distinguished by suffixes B, C, D, E and F respectively. Although stages 6 to 16 are the same in block diagram terms, there are significant differences in their detailed construction as will be explained in detail below, but these differences do not affect their basic operation.

It will be apparent that the output frequency on line 66B of stage 8 is variable between 2 and 2.999 MHz in 1 KHz steps. Correspondingly, the output of stage 10 on line 66C is variable between 2 and 2.9999 MHz in steps of 100 Hz, the output of stage 12 on line 66D is variable between 2 and 2.99999 MHz in steps of 10 Hz, and the output of stage 14 on line 66E is variable between 2 and 2.999999 MHz in steps of 1 Hz.

In the final stage, stage 16, the multiplier 42F is arranged to produce multiples in the range 180 to 280 MHz (instead of 180 to 270 MHz as in the case of the multipliers 42A to 42E). Therefore, the maximum output from divider 48F is 28 MHz. In addition, stage 16 omits the final divide-by-10 divider (divider 64A in stage 6). The result is, therefore, that VCO 54F is settable to produce an output variable between 20 and 30 MHz in steps of 1 Hz (the theoretically obtainable outputs above 30 MHz are not in fact produced by the VCO).

From the foregoing, it will be apparent that in the final output frequency on line 22, stage 4 sets the value of the least significant digit and stages 6 to 14 respectively set the values of the following digits of increasingly greater significance, while stage 16 sets the values of the two most significant digits.

The latches 30 and 44A to 44F are set by digital signals on a channel 70 so as to produce the required analogue outputs for setting the bandpass filters 28 and 42A to 42F to the appropriate settings necessary to produce the required output frequency on line 22. The digital signals on channel 70 are, in this example, produced from a read-only-memory (ROM) 72 which produces its digital outputs in dependence on the digital signals received on the control channel 24. The ROM 72 stores lock-up tables which enable any non-linearities between the analogue control inputs to the bandpass filters, and the frequencies to which these inputs set them, to be offset. However, it will be clear that the ROM 72 is not necessary if there are no such non-linearities or if the digital signals on line 24 have been pre-processed to eliminate any such non-linearities.

In order to increase the speed of operation of the synthesizer, that is, the speed with which it sets itself to produce a new, desired, output frequency, the analogue output of each of the latches 44A to 44F is also used, by means of the appropriate one of lines 67A to 67F, to set the corresponding VCO 54A to 54F to approximately the correct frequency for phase lock-up. This ensures that the VCO is set to a frequency which causes the loop to lock on the difference-frequency output from the mixer, rather than the sum-frequency output. Since the output frequency of the VCO in any of the stages is, at lock-up, approximately proportional to the output frequency of the bandpass filter in that stage, it is found that the VCO may be satisfactorily brought approximately to the correct frequency by using the same analogue control signal in that stage as controls the bandpass filter.

The use of the multiplier and bandpass filter in each of the synthesizer states is very advantageous, as compared with the use of, for example, a phase-locked loop for multiplication purposes, because it gives much better noise performance. If a phase-locked loop is used for multiplication purposes within each synthesizer stage, then the noise produced by each divider of these phase-locked loops is multiplied as well. This does not occur in the circuit arrangement described.

The divide-by-10 dividers following each of the bandpass filters in the stages 6 to 16 are advantageous because they produce much cleaner output signals, with lower spurious signals, than would be the case were they to be dispensed with and the reference frequency correspondingly reduced.

The use of the multipliers and selective bandpass filters is also advantageous because it enables much faster frequency setting than would phase-locked loops used for multiplication purposes, and such phase-locked loops also impose bandwith limitations. The synthesizer described can be easily controlled to carry out frequency sweeps over specified frequency bands and in steps of specified size.

Because of the cascaded arrangement of the stages, the noise performance (signal-to-noise ratio) and spurious signal content required for the stages, in order to produce a final output having a given signal-to-noise ratio and maximum spurious signal content, is much less for the stages at the beginning of the series than for the final stages especially stages 14 and 16. Therefore, although stages 4 to 16 are all nominally the same in terms of block diagram and function, in practice the detailed circuitry of the stages 14 and 16 would be considerably more sophisticated than for stages 4 to 12, in order to provide greater noise and spurious reduction.

If desired, the final output frequency on line 22 can be fed through a divide-by-2 divider 74 to produce a frequency on line 76 variable between 10 and 15 L MHz in $\frac{1}{2}$ Hz steps.

What is claimed is:

1. A stage for a frequency synthesizer, for producing an adjustable frequency whose value determines the value of one of the digits in the synthesized output frequency, the stage comprising
    means responsive to a predetermined reference frequency to produce multiples thereof lying within a predetermined frequency range,
    selectively-settable bandpass filter means for selecting one of the multiples,
    frequency dividing means connected to receive the selected multiple to produce a control frequency,
    controllable oscillator means producing the said adjustable frequency,
    phase-locked loop means connected to control the frequency of the controllable oscillator means in dependence on the said control frequency and on the adjustable frequency of a preceding stage, and
    pre-setting means producing a control signal connected to selectively set the bandpass filter means.

2. A stage according to claim 1, in which the phase-locked loop means comprises frequency mixing means connected to receive the said control frequency and the output of the controllable oscillator means, phase comparing means connected to compare the phase of the difference-frequency output of the mixing means with the phase of the adjustable frequency of the said preceding difference detected, and means feeding this signal to control the frequency of the controllable oscillator means, so as to set the controllable oscillator means to produce the adjustable frequency in dependence on the sum of the control frequency and the adjustable frequency of the preceding stage.

3. A stage according to claim 1, in which the controllable oscillator means is responsive to the said control signal so as to be set by it to approximately the correct value to produce phase lock in the phase-locked loop.

4. A frequency synthesizer, comprising
    an initial stage producing an adjustable frequency,
    a series of intermediate stages each producing a respective adjustable frequency and all connected in cascade so as each to receive the adjustable frequency of the preceding stage and with the first intermediate stage of the series connected to receive the adjustable frequency of the said initial stage, and a final stage connected to receive the adjustable frequency of the last intermediate stage in the said series, each stage producing a respective control frequency and including adjustable multiplying means for individually setting the value of that control frequency and output means responsive to the control frequency to produce the adjustable frequency of that stage, the output means of all the stages except the initial stage being in the form of a phase-locked loop including respective controllable oscillator means and having respective phase comparing means connected to compare the phase of the difference between the control frequency of that stage and the output of the controllable oscillator means of that stage with the phase of the adjustable frequency of the preceding stage so as to produce a signal dependent on any phase difference detected for setting the controllable oscillator means of that stage to a value to minimise that phase difference, each multiplying means comprising means responsive to a predetermined reference frequency to produce a plurality of multiples thereof lying in a respective predetermined frequency range, selectively settable bandpass filter means for selecting a particular one of the multiples, and frequency dividing means for dividing the selected multiples to produce the said control frequency, and control means for producing for each stage a respective first control signal for selectively setting the bandpass filter means of that stage, and means feeding to the controllable oscillator means of each stage a respective second control signal so as to set the oscillator means to approximately the frequency as exists at phase-lock.

* * * * *